(12) United States Patent
Lu

(10) Patent No.: US 6,879,927 B1
(45) Date of Patent: Apr. 12, 2005

(54) COMMUNICATION INTERFACE FOR VIRTUAL IC TESTER

(75) Inventor: Ziyang Lu, Camas, WA (US)

(73) Assignee: Credence Systems Corporation, Milpitas, CA (US)

( * ) Notice: Subject to any disclaimer, the term of this patent is extended or adjusted under 35 U.S.C. 154(b) by 91 days.

(21) Appl. No.: 10/624,614

(22) Filed: Jul. 21, 2003

(51) Int. Cl.[7] ............................................. G06F 19/00
(52) U.S. Cl. ..................... 702/123; 703/19; 714/741; 714/744; 714/731; 716/6
(58) Field of Search ......................... 702/117, 118, 702/119, 120, 122, 123; 703/13, 14, 15, 16, 19; 714/28, 30, 724, 731, 738, 741, 744; 716/4, 6

(56) References Cited

U.S. PATENT DOCUMENTS

| | | | | |
|---|---|---|---|---|
| 5,867,695 | A | * | 2/1999 | Amini et al. ................ 713/503 |
| 6,557,128 | B1 | * | 4/2003 | Turnquist .................... 714/724 |
| 6,557,133 | B1 | * | 4/2003 | Gomes ........................ 714/738 |
| 6,651,205 | B2 | * | 11/2003 | Takahashi .................... 714/738 |
| 6,678,643 | B1 | * | 1/2004 | Turnquist et al. ............. 703/14 |
| 6,715,093 | B1 | * | 3/2004 | Farmer et al. ............... 713/400 |
| 2002/0184560 | A1 | * | 12/2002 | Wang et al. .................... 714/25 |
| 2004/0158760 | A1 | * | 8/2004 | Farmer et al. ............... 713/500 |

OTHER PUBLICATIONS

Sehgal et al., "SOC Test Planning Using Virtual Test Access Architectures", IEEE, 2004.*
Schmid et al., "Advanced Synchronous Scan Test Methodology for Multi Clock Domain ASICs", IEEE, unknown date.*
Ashkinazy et al., "Tools for Validating Asynchronous Digital Circuits", IEEE, 1994.*

* cited by examiner

Primary Examiner—Patrick J. Assouad
(74) Attorney, Agent, or Firm—John Smith-Hill; Smith-Hill and Bedell

(57) ABSTRACT

A method of verifying test data for testing an integrated circuit device having multiple device time domains includes selecting a virtual tester time domain and, if the cycle duration of the virtual tester time domain is equal to the cycle duration of one of the multiple device time domains, translating the test data for each device time domain other than that one time domain to the virtual tester time domain and otherwise translating the test data for each device time domain to the virtual tester time domain. The translated test data is then applied to a device logic simulator that simulates integrated circuit device.

12 Claims, 2 Drawing Sheets

COMMUNICATION INTERFACE FOR VIRTUAL IC TESTER

BACKGROUND OF THE INVENTION

This invention relates to a communication interface for a virtual IC tester.

An integrated circuit (IC) designer typically develops an IC design by creating an executable program that behaves in a desired way and is commonly referred to as a device logic simulator. The designer uses known techniques to convert the device logic simulator to an IC design that can be implemented in a physical IC device.

It is conventional to test a semiconductor integrated circuit device in order to determine whether it behaves as expected. A typical "per-pin" semiconductor integrated circuit tester includes multiple tester channels each capable of supplying a stimulus signal to an IC terminal or evaluating a response signal produced at that terminal. A typical IC tester is cycle based, i.e. it carries out a test in a succession of tester cycles. The start of a tester cycle is defined by an edge of a master clock signal. Prior to the start of a tester cycle, each tester channel receives (or internally generates) an instruction defining one or more states that the channel should assume for the tester cycle. A state may be NULL (no test activity) but otherwise the state defines a test event by specifying an activity that the channel is to perform during the tester cycle (e.g. FORCE HIGH, FORCE LOW, COMPARE HIGH, COMPARE LOW) and the programmable delay time (relative to the clock edge) at which the channel is to perform the specified activity. Thus, in one tester cycle a first tester channel might stimulate the device under test (DUT) by driving a first terminal of the DUT to a desired level at time t1 following the clock edge and a second tester channel might evaluate the response of the DUT to the stimulus by comparing the voltage level of the signal developed at a second terminal with a desired threshold level at a time t2 following the clock edge (where t1 and t2 are each less than the duration of the clock cycle). That particular tester cycle is then over and the test proceeds with another tester cycle.

The number of test events (force or compare) that can occur at a given pin during a given tester cycle is fixed and is typically in the range from one to four, depending on the particular tester.

A test engineer creates a test program that generates test data defining the state of each tester channel for each tester cycle having regard to the desired behavior of the device. Before employing the test program to control operation of a physical tester for testing a physical IC device, it is necessary to verify that the test data generated by the test program will appropriately test the device. This is done by using a virtual tester to test the device logic simulator.

The virtual tester is a program that receives the test data for a given tester cycle, and for each channel of the physical tester that is to perform a FORCE or COMPARE activity in that cycle, the virtual tester supplies parameter values representing the level (HIGH or LOW) of the FORCE or COMPARE activity and the programmable delay of the activity to the device logic simulator via a virtual tester interface. The device logic simulator carries out logic operations employing these parameter values and supplies parameter values representing the results of the COMPARE activities to the virtual tester via the virtual tester interface. The virtual tester interface is a communication interface that converts the parameter values provided by the virtual tester into a form acceptable to the device logic simulator and converts the result values provided by the device logic simulator to a form acceptable to the virtual tester. If the virtual tester determines that the device logic simulator behaved as expected, it implies that the test data is suitable for testing the physical device.

Traditional cycle-based testers are synchronous, in the sense that all the tester channels operate under control of the same master clock signal and all the test data is defined relative to a common tester clock rate. Conventionally, the virtual tester, the virtual tester interface and the device logic simulator are also tester cycle based, using the same tester rate. Thus, referring to FIG. 1, the virtual tester and the virtual tester interface operate under control of the master clock MCLK for receiving the test data, providing parameter values to the device logic simulator, and receiving the parameter values representing the device logic simulator's responses. The device logic simulator carries out its logic operations under control of the same master clock signal.

The conventional synchronous tester that has been described thus far is suitable for testing an IC device that has been designed so that all the circuit elements operate in response to a single clock signal. Such an IC device is said to have a single time domain. When the conventional tester is used to test a device having a single time domain, the tester is operated so that its cycle duration is equal to the period of the device clock signal.

Integrated circuit devices that are commercially available include devices that have multiple time domains. A first group of pins might be connected to circuit elements that operate in response to a master clock signal at a frequency $F_A$ and a second group of pins might be connected to circuit elements that operate in response to a master clock signal at a frequency $F_B$. The group of circuit elements that operate in response to the clock signal at a given frequency are said to constitute a time domain of the device. The circuit elements that are connected to the first group of pins constitute time domain A and the circuit elements that are connected to the second group of pins constitute time domain B.

Some emerging testers support testing of IC devices having multiple time domains. In the case of an IC device having two time domains, as described above, the tester would typically employ a first group of tester channels connected to the first group of pins and a second group of tester channels connected to the second group of pins. The test activities conducted by the first group of channels take place in response to a first master clock signal and the test activities conducted by the second group of tester channels take place in response to a second master clock signal. Such a tester is considered to be asynchronous since there is no single tester cycle governing progression of the test activities at the terminals of all the channels. The test data is bounded to the different time domains, in that some portions of the test proceed at the rate of time domain A and other portions of the test proceed at the rate of time domain B.

Conventionally, the device logic simulator that is used to create an IC design having multiple time domains and to verify the test data for such an IC device is a single executable program that operates at a uniform rate of progression. Since there is no single tester cycle governing operation of the tester, the device logic simulator cannot run synchronously with the tester. It would in principle be possible to employ an asynchronous communication interface between an asynchronous virtual tester and the device logic simulator but the logic simulator would then have to deal with each time domain independently. Further, this approach would expose the specifics of the tester's architecture to the logic simulator. Thus, as new testers were developed, new virtual tester interfaces would be required. However, in order to preserve the value of a virtual tester interface that has been developed for a given device logic simulator, it is desirable that the virtual tester interface should not be dependent on the architecture of the virtual tester. Consequently, it is desirable to employ a synchronous communication interface between an asynchronous virtual tester and the device logic simulator for an IC device having multiple time domains.

SUMMARY OF THE INVENTION

In accordance with a first aspect of the invention there is provided a method of verifying test data for testing an integrated circuit device having multiple device time domains each having a cycle duration, comprising selecting a virtual tester time domain having a cycle duration, if the cycle duration of the virtual tester time domain is equal to the cycle duration of one of the multiple device time domains, translating the test data for each device time domain other than said one time domain to the virtual tester time domain and otherwise translating the test data for each device time domain to the virtual tester time domain, and applying the translated test data to a device logic simulator that simulates the integrated circuit device.

In accordance with a second aspect of the invention there is provided a virtual tester for evaluating primary test data for testing a physical device that implements a device logic simulator and has multiple time domains, by transforming the primary test data to a format that is compatible with a virtual tester interface and applying the transformed test data through the virtual tester interface to the device logic simulator, the virtual tester comprising a first means for examining the primary test data and determining whether at least one of the time domains is complex and, in the event that only one time domain is complex, selecting the complex time domain, and in the event that at least two time domains are complex, selecting the complex time domain that has the shortest cycle duration, a second means for receiving the primary test data for a physical tester domain other than the selected complex domain, mapping time of occurrence of an event in said physical tester domain to a corresponding time in the selected complex domain, and generating secondary test data for said physical tester domain wherein the time of occurrence of said event is specified by reference to a cycle boundary of the selected complex time domain, and a third means responsive to a master clock signal at a predetermined frequency for transforming the secondary test data into a format that is compatible with the synchronous virtual tester interface.

In accordance with a third aspect of the invention there is provided apparatus for evaluating primary test data for testing a physical device having multiple time domains, the apparatus comprising a virtual tester and a virtual tester interface, the virtual tester including a first means for examining the primary test data and determining whether at least one of the time domains is complex and, in the event that only one time domain is complex, selecting the complex time domain, and in the event that at least two time domains are complex, selecting the complex time domain that has the shortest cycle duration, a second means for receiving the primary test data for a physical tester domain other than the selected complex domain, mapping time of occurrence of an event in said physical tester domain to a corresponding time in the selected complex domain, and generating secondary test data for said physical tester domain wherein the time of occurrence of said event is specified by reference to a cycle boundary of the selected complex time domain, a third means responsive to a master clock signal at a predetermined frequency for transforming the secondary test data into a format that is compatible with the virtual tester interface, and the virtual tester interface being located functionally between the virtual tester and the device logic simulator, the virtual tester interface being responsive to said master clock signal for passing signals between the virtual tester and the device logic simulator.

In accordance with a fourth aspect of the invention there is provided a method of carrying out virtual-cycle-based and digital-pin-based communication of test events between a virtual tester and a device logic simulator in a test plan that includes force and compare events, comprising determining, over all virtual cycles and all digital pins, the highest number of force events at a digital pin in a virtual cycle, determining, over all virtual cycles and all digital pins, the highest number of compare events at a digital pin in a virtual cycle, creating a data structure having, for each virtual cycle and each digital pin, entries for said highest number of force events and said highest number of compare events, for a given virtual cycle and a given digital pin for which the number of force events is less than said highest number of force events, populating the data structure with at least one value that defines a valid force event at the given digital pin in the given virtual cycle and at least one value that does not define a valid force event at the given digital pin in the given virtual cycle, for a given virtual cycle and a given digital pin for which the number of compare events is less than said highest number of compare events, populating the data structure with at least one value that defines a valid compare event at the given digital pin in the given virtual cycle and at least one value that does not define a valid compare event at the given digital pin in the given virtual cycle.

In accordance with a fifth aspect of the invention there is provided a computer readable medium containing software which, when read and executed by a computer, causes the computer to carry out a method of verifying test data for testing an integrated circuit device having multiple device time domains each having a cycle duration, comprising selecting a virtual tester time domain having a cycle duration, if the cycle duration of the virtual tester time domain is equal to the cycle duration of one of the multiple device time domains, translating the test data for each device time domain other than said one time domain to the virtual tester time domain and otherwise translating the test data for each device time domain to the virtual device time domain-, applying the translated test data to the a device logic simulator that simulates the integrated circuit device.

In accordance with a sixth aspect of the invention there is provided a computer readable medium containing software which, when read and executed by a computer, causes the computer to carry out a method of of carrying out virtual-cycle-based and digital-pin-based communication of test events between a virtual tester and a device logic simulator in a test plan that includes force and compare events, comprising determining, over all virtual cycles and all digital pins, the highest number of force events at a digital pin in a virtual cycle, determining, over all virtual cycles and all digital pins, the highest number of compare events at a digital pin in a virtual cycle, creating a data structure having, for each virtual cycle and each digital pin, entries for said highest number of force events and said highest number of compare events, for a given virtual cycle and a given digital pin for which the number of force events is less than said highest number of force events, populating the data structure with at least one value that defines a valid force event at the given digital pin in the given virtual cycle and at least one value that does not define a valid force event at the given digital pin in the given virtual cycle, for a given virtual cycle and a given digital pin for which the number of compare events is less than said highest number of compare events, populating the data structure with at least one value that defines a valid compare event at the given digital pin in the given virtual cycle and at least one value that does not define a valid compare event at the given digital pin in the given virtual cycle.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 2:
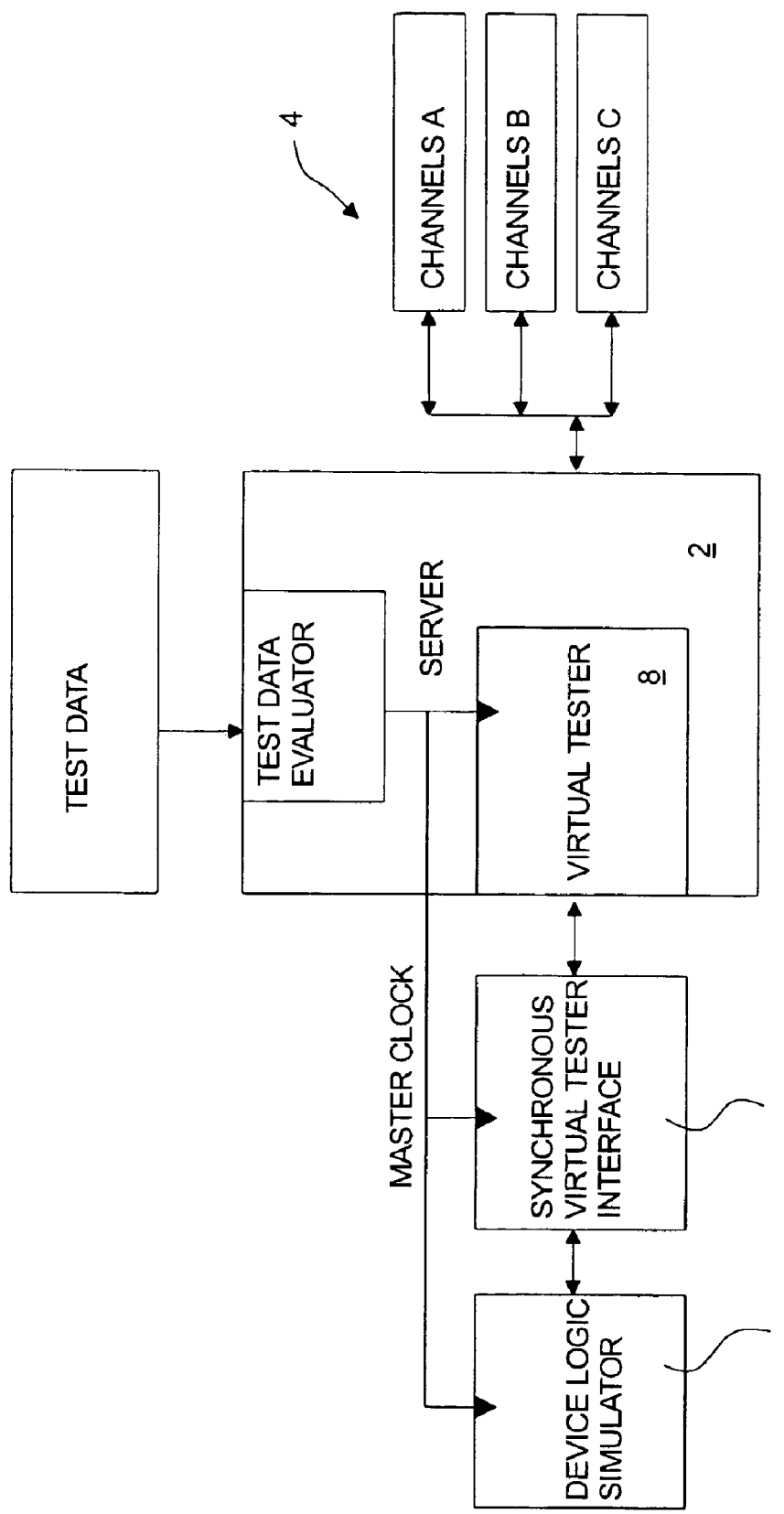
FIG. 2 illustrates a tester that includes a virtual tester interface embodying the present invention.

FIG. 2 illustrates a tester comprising a server 2 that runs on a computing platform (not separately shown) and is coupled to three groups of tester channels 4, designated channels A, channels B and channels C respectively, for testing a physical IC device having three time domains, referred to herein as domains A, B and C. When the tester is being used to test a physical IC device, the server 2 executes a process that receives test data for each time domain, generates stimulus signals for each time domain, sends the stimulus signals to the appropriate tester channels 4, receives response signals from the tester channels, and evaluates the response signals against expected response behavior.

In order to evaluate the test data using a device logic simulator 6, the server process includes a virtual tester 8 that sends parameter values to, and receives parameter values from, the device logic simulator via a virtual tester interface 10.

The tester channels 4 have been mentioned in order to provide the context in which the server operates. Unless the context indicates otherwise, future references in this specification to a test relate to use of the server to evaluate test data using the device logic simulator.

Figure 1:
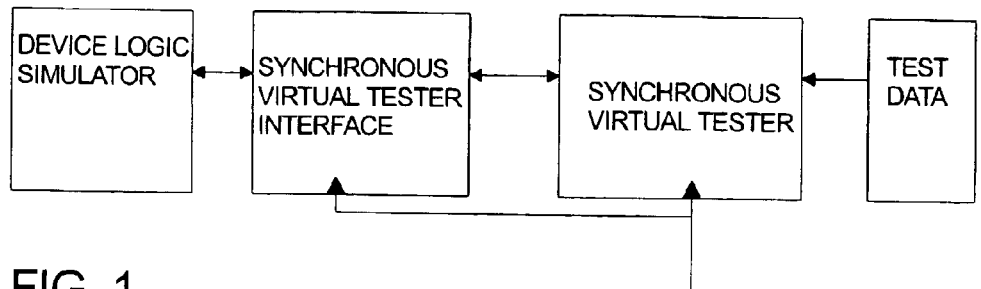
FIG. 1 is a simplified block diagram illustrating interaction between test data and a device logic simulator employing a virtual tester and a virtual tester interface in accordance with the prior art.
Figure 3:
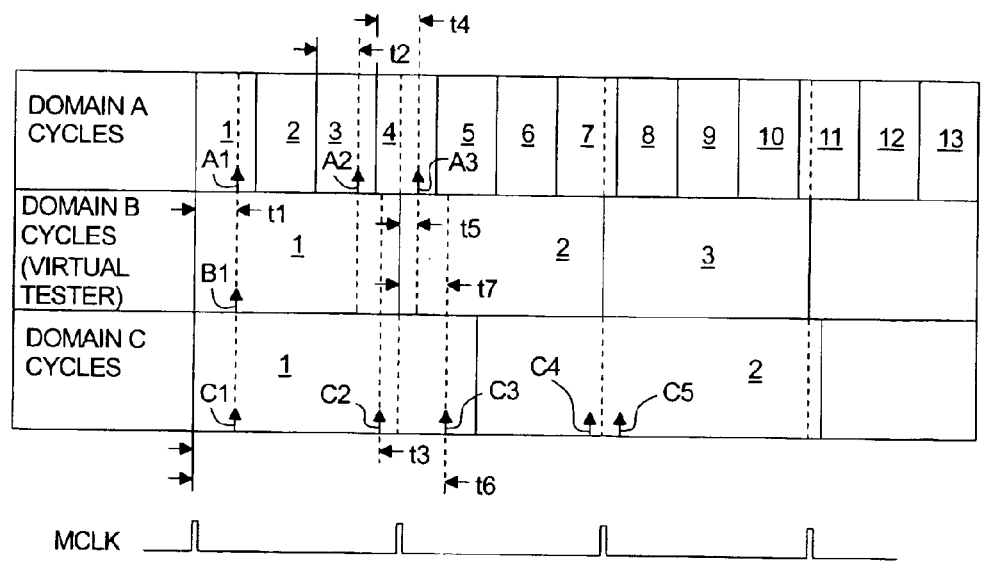
FIG. 3 is a timing diagram illustrating time domain cycles in an asynchronous virtual tester.

Referring to FIG. 3, the cycle duration for domain A is shorter than that for domain B, and the cycle duration for domain B is shorter than that for domain C. In an embodiment of the invention, one of the three domains is selected for operation of the synchronous virtual tester and the virtual tester interface.

The test engineer who creates the test program is aware of the multiple domains and consequently the test program, and the test data generated by the test program, reflects the characteristics of the three domains. For example, the test data for one domain might represent a simple progression of states whereas the test data for another domain might include a conditional or unconditional branching instruction or a launching instruction.

The server evaluates the test data and calculates the virtual tester cycle based on the software objects that are included in the test data as representing the activities in the various time domains respectively. Some of the objects may be relatively simple and represent a linear sequence of operations that are executed at the rate that characterizes the time domain whereas other objects may represent more complex sequences including, for example, conditional and unconditional branching where the virtual tester needs to use cycle boundaries and device logic simulator responses to select the next test activity.

The server examines the test data for the time domains respectively and determines whether each time domain is simple (linear progression of states) or complex (e.g with branching). If the server identifies at least one of the time domains as being complex, the server selects the complex time domain for which the cycle duration is the shortest as the virtual tester time domain and employs the clock for this domain as the master clock for both the virtual tester and the virtual tester interface, as depicted in FIG. 2.

Referring again to FIG. 3, let us assume that domain A is simple and domains B and C are complex. In this case, since domain B is of shorter cycle duration than domain C, the server selects domain B as the virtual tester time domain. The tester cycles of the different time domains may have different levels of granularity, i.e. the level of precision with which the programmable delay can be specified. The server calculates a level of precision that will allow the programmable delay of an event in domain A or C to be specified with a sufficient degree of precision in the virtual tester time domain B.

The synchronous virtual tester employs the test data for the various domains to generate activity commands and programmable delays for each time domain based on the cycle boundaries of the virtual tester cycle and the precision with which the delays are specified in the several domains. Referring to FIG. 3, the server maps the domain A events for cycles 1, 2, 3 and 4 to virtual tester cycles 1 and 2 and maps the domain C events for cycles 1 and 2 to virtual tester cycles 1, 2 and 3.

FIG. 3 illustrates the case in which the beginning of cycle 1 for domains A and C is time aligned with the beginning of cycle 1 for domain B, but it is not necessary that this be so. It is only necessary that the virtual tester be able to specify time values in domain B with a sufficient degree of precision to express any permitted value of the delay in domain A or C.

Let us assume, by way of example, that the test data defines a test such that events occur in the respective time domains at the times indicated in FIG. 3 by the arrows A1, A2, etc.

The events A1, B1 and C1 occur simultaneously at the programmable delay t1 following the start of the first tester cycle, where t1 is shorter than the cycle duration $T_A$ of domain A. The test-data thus defines the three events by the nature of the activity and, in each case, by the cycle number 1 and the programmable delay t1.

The event A2 occurs during tester cycle 3 of domain A with a programmable delay t2. The time of this activity maps to time $2T_A+t2$ in tester cycle 1 of domain B. Accordingly, the virtual tester converts the event that is defined by the prescribed activity at time t2 in cycle 3 of domain A into the corresponding activity at time $2T_A+t2$ in cycle 1 of domain B.

Event C2 occurs with a delay t3 relative to the start of cycle 1 of domain C and it can be seen that this corresponds to a delay t3 in cycle 1 of domain B.

Event A3 occurs at a delay t4 in cycle 4 of domain A. The virtual tester calculates that this delay places the event A3 within cycle 2 of domain B with a delay t5, which is equal to $t4-(T_B-3T_A)$.

Finally, the event C3, which occurs in cycle 1 of domain C with a delay t6, is described by the virtual tester as occurring in cycle 2 of the virtual tester's cycle with a delay t7, which is equal to $t6-T_B$.

Since the virtual tester operates in accordance with only one time domain, it appears to the virtual tester interface to be a synchronous virtual tester. Consequently, the virtual tester interface may behave as a synchronous interface.

The following table illustrates, for each event described above, the cycle number in the virtual tester time domain and the programmable delay.

| Event | Cycle | Delay |
|---|---|---|
| A1 | 1 | t1 |
| A2 | 1 | $2T_A + t2$ |
| A3 | 2 | $t4 - (T_B - 3T_A)$ |
| B1 | 1 | t1 |
| C1 | 1 | t1 |
| C2 | 2 | t3 |
| C3 | 2 | $t6 - T_B$ |

Treatment of events that occur in tester cycles that are wholly within a virtual tester cycle is straightforward: since domain A cycles 1, 2 and 3 are wholly within virtual tester cycle 1, the virtual tester sends for the test data that specifies events A1, A2 and B1 before the beginning of virtual tester cycle 1. Similarly, before the beginning of virtual tester cycle 2 the virtual tester sends for the test data that specifies the events, if any, that will take place in any tester cycle that is wholly within virtual tester cycle 2, and so on.

Since the boundaries of the tester cycles do not generally coincide in time, the events in a cycle that spans the boundary between two consecutive cycles of the virtual tester may need to be shared between the two consecutive virtual tester cycles. For example, since the end of virtual tester cycle 1 occurs partway through cycle 1 of domain C, the virtual tester can only perform some of the activities for domain C cycle 1 during virtual tester cycle 1. Specifically, the virtual tester performs the activities for events C1 and C2 during virtual tester cycle 1, and this necessitates that prior to virtual tester cycle 1, the virtual tester sends for the test data for events C1 and C2 so that the events will take place at the appropriate times during virtual tester cycle 1. Prior to virtual tester cycle 2, the virtual tester sends for the test data specifying the events that are to take place during the remainder of domain C cycle 1, e.g. event C3, and then sends for the test data defining the events that will take place during physical domain C cycle 2 but before the end of virtual tester cycle 2, i.e. the data defining the event C4 but not event C5. Also, since the end of virtual tester cycle 1 occurs partway through cycle 4 of domain A, the virtual tester sends for the test data defining the event A3, which will take place during physical domain A cycle 4 but before the end of virtual tester cycle 2, prior to the start of virtual tester cycle 2.

If the events C1–C5 are COMPARE events, which require that result values be received from the device logic simulator, the virtual tester receives only part of the device responses for physical domain C cycle 1 from the device logic simulator during virtual tester cycle 1. When the virtual tester receives the device response for event C3, which occurs in virtual tester cycle 2, it examines this response against the test data for the remainder of physical domain C cycle 1 before moving on to process responses for physical domain C cycle 2 (events C4 and C5). In this manner, the physical cycles are patched up on the boundaries of the virtual tester cycle.

Since the virtual tester supplies parameter values to, and receives parameter values from, the device logic simulator based on the virtual tester cycle, the virtual tester appears to the device logic simulator to be a synchronous virtual tester. The tester architecture is concealed from the simulator by the synchronous tester interface and the virtual tester and, consequently, a change in the tester architecture does not affect the logic simulator.

In the event that all the time domains are simple, the virtual tester selects the domain having the longest cycle duration as the virtual tester cycle since this permits more data to be transferred in each virtual tester cycle.

Although the device logic simulator is an executable program rather than a hardware device, it is convenient to refer to digital pins of the device logic simulator. The digital pins are analogous to the pins of the physical IC device that is designed on the basis of the device logic simulator. During a test, force and compare events take place at the digital pins of the device logic simulator.

As mentioned previously, in the conventional synchronous tester that is used for testing a physical IC device having a single time domain, the number of test events that can occur at a given pin during a given tester cycle is fixed. Similarly, in the case of the corresponding conventional synchronous virtual tester that is used to test a device logic simulator that models a physical IC device having a single time domain, the number of test events that can occur at a given digital pin during a given tester cycle is fixed. In the case of a virtual tester embodying the present invention, where the virtual tester cycle may cover several physical tester cycles, the number of test events that can occur at a given pin during a given virtual tester cycle can vary from test to test, depending on the length of the virtual tester cycle and the number of test events per physical tester cycle. At the start of a test, the server process determines, for that test, the highest number of force events (FORCE_EDGES) that occur at any one pin in any one virtual tester cycle and the highest number of compare events (COMPARE_EDGES) that occur at any one pin in any one virtual tester cycle.

The data format that is used for communicating between the virtual tester and the device logic simulator specifies the values FORCE_EDGES and COMPARE-EDGES as variables that are applicable to all digital pins and all virtual tester cycles during the test. These values will remain the same during the test, and will be the same for all digital pins, but may vary from test to test. The virtual tester creates a data structure containing, for each virtual tester cycle and for each digital pin, FORCE_EDGES entries for force events and COMPARE_EDGES entries for compare events and populates each entry with two values, namely event logic and event timing. Event timing specifies the number of nanoseconds into the virtual tester cycle that the event should occur. In order for the event to occur, the event timing must be positive. Consequently, a negative value of event timing is used to indicate that a particular event is not applicable for a pin in that virtual tester cycle.

The event logic is specified using the common four value system (0, 1, Z, X). If an event is specified with non-negative event timing, then the event logic determines the action that the device logic simulator should take (on a per pin basis). For a force event, the event logic values may be those listed:

| | | |
|---|---|---|
| FORCE_LOW | Drive the device pin low | 0 |
| FORCE_HIGH | Drive the device pin high | 1 |
| FORCE_OFF | Turn the device pin driver off | Z |

For a compare event, the event logic values may be those listed:

| | | |
|---|---|---|
| COMPARE_LOW | Acquire data and expect device pin to be low | 0 |
| COMPARE_HIGH | Acquire data and expect device pin to be high | 1 |
| COMPARE_MIDBAND | Acquire data and expect device pin to be in the middle | Z |

For each compare event with non-negative timing, the interface converts the device pin response provided by the device logic simulator into one of the values given below:

| | | |
|---|---|---|
| RESPONSE_LOW | Got low pin response | 0 |
| RESPONSE_HIGH | Got high pin response | 1 |
| RESPONSE_MIDBAND | Got middle pin response | Z |
| RESPONSE_UNKNOWN | Got invalid pin response | X |

Each digital pin is assigned a unique value, and the virtual tester uses this value as a pointer into the data structure that specifies the force and compare events. During a given virtual tester cycle, the virtual tester selects the digital pins sequentially, and for each digital pin the virtual tester reads the logic values from the data structure, processes the force events and the compare events, receives the responses to the compare events for which the event timing is not negative, and sends the responses to the server process.

By treating all digital pins and all virtual tester cycles alike with respect to the number of force and compare events, the virtual tester and the virtual tester interface are simplified.

Although the invention has been described in the context of an implementation in which the duration of the virtual tester cycle is equal to the cycle duration of one of the time domains, this is not essential to the invention. The duration of the virtual tester cycle is selected in order to ensure that the virtual tester cycle can align the independent time domains, i.e. ensure the proper temporal relationships across time domains, while still preserving the ability of the time domains to have complex behavior.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. A method of verifying test data for testing an integrated circuit device having multiple device time domains each having a cycle duration, comprising:

selecting a virtual tester time domain having a cycle duration, if the cycle duration of the virtual tester time domain is equal to the cycle duration of one of the multiple device time domains, translating the test data for each device time domain other than said one time domain to the virtual tester time domain and otherwise translating the test data for each device time domain to the virtual tester time domain, and applying the translated test data to a device logic simulator that simulates the integrated circuit device.

2. A method according to claim 1, comprising, for each device time domain:

determining whether the time domain is complex or simple, in the event that all time domains are simple, selecting the time domain with the longest cycle duration as the virtual tester time domain, in the event that only one time domain is complex, selecting the complex time domain as the virtual tester time domain, in the event that at least two time domains are complex, selecting the complex time domain having the shortest cycle duration as the virtual tester time domain.

3. A method according to claim 1, comprising:

analyzing the test data and identifying portions of the test data corresponding to the device time domains respectively and, for each device time domain, determining whether the time domain is complex or simple based on the test data, in the event that all device time domains are simple, selecting the time domain with the longest cycle duration as the virtual tester time domain, in the event that only one device time domain is complex, selecting the complex time domain as the virtual tester time domain, in the event that at least two device time domains are complex, selecting the complex time domain having the shortest cycle duration as the virtual tester time domain.

4. A method according to claim 1, comprising applying the test data to the device logic simulator using a virtual tester and a virtual tester interface that operate synchronously with the device logic simulator.

5. A virtual tester for evaluating primary test data for testing a physical device that implements a device logic simulator and has multiple time domains, by transforming the primary test data to a format that is compatible with a virtual tester interface and applying the transformed test data through the virtual tester interface to the device logic simulator, the virtual tester comprising:

a first means for examining the primary test data and determining whether at least one of the time domains is complex and, in the event that only one time domain is complex, selecting the complex time domain, and in the event that at least two time domains are complex, selecting the complex time domain that has the shortest cycle duration, a second means for receiving the primary test data for a physical tester domain other than the selected complex domain, mapping time-of-occurrence of an event in said physical tester domain to a corresponding time in the selected complex domain, and generating secondary test data for said physical tester domain wherein the time of occurrence of said event is specified by reference to a cycle boundary of the selected complex time domain, and a third means responsive to a master clock signal at a predetermined frequency for transforming the secondary test data into a format that is compatible with the synchronous virtual tester interface.

6. A virtual tester according to claim 5, wherein the first means selects the time domain that has the longest cycle duration in the event that the first means determines that no time domain is complex.

7. Apparatus for evaluating primary test data for testing a physical device having multiple time domains, the apparatus comprising a virtual tester and a virtual tester interface, the virtual tester including:

a first means for examining the primary test data and determining whether at least one of the time domains is complex and, in the event that only one time domain is complex, selecting the complex time domain, and in the event that at least two time domains are complex, selecting the complex time domain that has the shortest cycle duration, a second means for receiving the primary test data for a physical tester domain other than the selected complex domain, mapping time of occurrence of an event in said physical tester domain to a corresponding time in the selected complex domain, and generating secondary test data for said physical tester domain wherein the time of occurrence of said event is specified by reference to a cycle boundary of the selected complex time domain, a third means responsive to a master clock signal at a predetermined frequency for transforming the secondary test data into a format that is compatible with the virtual tester interface, and the virtual tester interface being located functionally between the virtual tester and the device logic simulator, the virtual tester interface being responsive to said master clock signal for passing signals between the virtual tester and the device logic simulator.

8. A method of carrying out virtual-cycle-based and digital-pin-based communication of test events between a virtual tester and a device logic simulator in a test plan that includes force and compare events, comprising:

determining, over all virtual cycles and all digital pins, the highest number of force events at a digital pin in a virtual cycle, determining, over all virtual cycles and all digital pins, the highest number of compare events at a digital pin in a virtual cycle, creating a data structure having, for each virtual cycle and each digital pin, entries for said highest number of force events and said highest number of compare events, for a given virtual cycle and a given digital pin for which the number of force events is less than said highest number of force events, populating the data structure with at least one value that defines a valid force event at the given digital pin in the given virtual cycle and at least one value that does not define a valid force event at the given digital pin in the given virtual cycle, for a given virtual cycle and a given digital pin for which the number of compare events is less than said highest number of compare events, populating the data structure with at least one value that defines a valid compare event at the given digital pin in the given virtual cycle and at least one value that does not define a valid compare event at the given digital pin in the given virtual cycle.

9. A method according to claim 8, further comprising, for a given virtual cycle and a given digital pin for which the number of compare events is zero and the number of force events is zero, populating the data structure with values that do not define either a valid force event or a valid compare event at the given digital pin in the given virtual cycle.

10. A computer readable medium containing software which, when read and executed by a computer, causes the computer to carry out a method of verifying test data for testing an integrated circuit device having multiple device time domains each having a cycle duration, comprising:

selecting a virtual tester time domain having a cycle duration, if the cycle duration of the virtual tester time domain is equal to the cycle duration of one of the multiple device time domains, translating the test data for each device time domain other than said one time domain to the virtual tester time domain and otherwise translating the test data for each device time domain to the virtual device time domain, applying the translated test data to the a device logic simulator that simulates the integrated circuit device.

11. A computer readable medium containing software which, when read and executed by a computer, causes the computer to carry out a method of of carrying out virtual-cycle-based and digital-pin-based communication of test events between a virtual tester and a device logic simulator in a test plan that includes force and compare events, comprising:

determining, over all virtual cycles and all digital pins, the highest number of force events at a digital pin in a virtual cycle, determining, over all virtual cycles and all digital pins, the highest number of compare events at a digital pin in a virtual cycle, creating a data structure having, for each virtual cycle and each digital pin, entries for said highest number of force events and said highest number of compare events, for a given virtual cycle and a given digital pin for which the number of force events is less than said highest number of force events, populating the data structure with at least one value that defines a valid force event at the given digital pin in the given virtual cycle and at least one value that does not define a valid force event at the given digital pin in the given virtual cycle, for a given virtual cycle and a given digital pin for which the number of compare events is less than said highest number of compare events, populating the data structure with at least one value that defines a valid compare event at the given digital pin in the given virtual cycle and at least one value that does not define a valid compare event at the given digital pin in the given virtual cycle.

12. A computer readable medium according to claim 11, wherein the software, when read and executed by the computer, causes the computer to carry out a method that further comprises, for a given virtual cycle and a given digital pin for which the number of compare events is zero and the number of force events is zero, populating the data structure with values that do not define either a valid force event or a valid compare event at the given digital pin in the given virtual cycle.

* * * * *